United States Patent [19]
Yang

[11] Patent Number: 5,400,348
[45] Date of Patent: Mar. 21, 1995

[54] PACKET START DETECTION USING CHECK BIT CODING

[76] Inventor: Sung-Moon Yang, 1665 Fallen Leaf La., Los Altos, Calif. 94024

[21] Appl. No.: 939,806

[22] Filed: Sep. 3, 1992

[51] Int. Cl.$^6$ ............................................. H03M 13/00
[52] U.S. Cl. ........................................................ 371/42
[58] Field of Search ............................. 371/5.4, 42, 43; 370/105.01, 105.02

[56] References Cited
U.S. PATENT DOCUMENTS 3,605,090  9/1971  Burton .
3,913,068  10/1975  Patel ................................. 371/42 X
4,476,458  10/1984  Dollard ................................. 371/43
4,521,886  6/1985  Dollard et al. ......................... 371/43
5,051,998  9/1991  Murai et al. ......................... 371/5.4 X
5,282,211  1/1994  Manlick et al. ....................... 371/5.4

Primary Examiner—Roy N. Envall, Jr.
Assistant Examiner—Chuong D. Ngo
Attorney, Agent, or Firm—Joel I. Rosenblatt

[57] ABSTRACT

In a digital radio system, data is transmitted in packet form. A check or parity bit is used to determine whether any errors have occurred between data transmission and demodulation. That same check bit is used to identify its location in a packet. From that check bit location, it is then possible to identify the starting and ending data bits in a packet and to correctly interpret the packet data.

28 Claims, 3 Drawing Sheets

PACKET START DETECTION USING CHECK BIT CODING

FIELD OF THE INVENTION

This invention relates to field of high frequency communication using an RF carrier modulated by encoded digital information.

BACKGROUND OF THE PRIOR ART

Intelligence transmission in digital form is common in digital radio systems. In these systems, information, typically in the form of an analog signal, produces a digital waveform. The digital waveform, in turn, represents information. This information is sent within a radio system by modulating an RF carrier. However, transmission using such a modulated RF carrier can result in errors in the received signal. These errors may be produced due to interference in the radio transmission. Additional errors may enter the data stream due to the phase of the demodulating frequency. For example, depending on the demodulating frequency phase $\phi$, the sign of the sine or cosine demodulating sinusoid may be $\pm$ sine or $\pm$ cosine (four possibilities).

Additionally, the transmission of the data is in serial form with the information collected in discrete packets. These packets may be in serial form or parallel form. The packets have starting and ending bits and parity or check bits. To properly interpret the data it may be necessary to identify the start or end of each packet, the separate data bit locations in the packet and to correctly interpret the check bit.

In order to determine whether an error has entered the data stream or more particularly a packet in the data stream, the check bit is added. The use of check bits for detecting and correcting errors in the received data is well known. For example, the use of coding bits in connection with digital radio systems is fully discussed, in OPTIMAL CONVOLUTIONAL SELF-ORTHOGONAL CODE WITH AN APPLICATION TO DIGITAL RADIO, (CSOC's) G. D. Martin, AT&T Bell Laboratories, North Andover, Mass. 01845; 1985 IEEE. Other discussions of Convolutional Self-Orthogonal Codes (CSOC's) are *Threshold Decoding*, J. L. Massey, MIT Press 1963 and *New Convolutional Codes*, W. W. Wu, Part I IEEE TRANS. COMMUN. COM-23, pages 942-956.

In the past, error correction and packet start definition has been treated as two separate operations. In the operation of a CSOC, the encoding bit is stripped from the data stream leaving the data or information bit stream. The data stream is then reencoded using the same algorithm as used by the transmitter encoder to encode the check bit. The reencoded check bit produced at the receiver is then compared with the transmitted, stripped check bit (for example, in an exclusive OR). The output of the exclusive OR is called a Syndrome bit or "S" bit. The purpose of the Syndrome bit is to indicate whether the check bit received in the data stream by the receiver is the same as the check bit encoded at the transmitter. This indication may be a "T" or "F" bit. These techniques for using the Syndrome bit for error detection and correction in the data stream, as discussed above, are contained within the disclosed references. As use of CSOC's and the generation of Syndrome bits are well known in the art, they are not discussed.

SUMMARY OF THE INVENTION

In the disclosed invention, an encoded check bit or parity bit for error detection and correction is used for the dual purpose of error detection and correction and for indicating a packet reference data bit location; for example, the check bit location in a packet. As shown, a data stream may be encoded to produce a parity bit or check bit. In the preferred embodiment, that encoding is produced through Convolutional Self-Orthogonal Codes (CSOC's). It will be appreciated by those skilled in the art that this invention can be used with other types of encoding schemes and should not be thought of as limited to the preferred embodiment shown. Typically, the encoded bit is put in the least significant bit position. The effect is to raise the noise level to a minimum degree without affecting the information in the other bit positions. In the preferred embodiment, the check bit location is in packet bit location 24. Information is contained within bits 1 to 23, For reference purposes only, the most significant bit with regard to the preferred embodiment would be bit location 1. For the purposes of explanation, bit locations 1 to 24 are used for a 24 bit packet. Conventionally, the 24 bit packet would be numbered from bit location 0 to bit location 23.

In receiving the encoded serial digital signal, a Test Check Bit location in the serial stream is selected and that respective Test Check Bit is stripped from the data stream. The result is a conversion from 24 bit to a 23 bit discrete packet. The data clock is adjusted accordingly then for a 23-bit packet and that 23-bit packet is reencoded using the same encoding algorithm as at the transmitter. The purpose of the reencoding is to attempt to reproduce the same check bit at the receiver as was produced at the transmitter. As that reproduced check bit should be the same as produced at the transmitter, the check bit produced at the receiver may be compared with the test check bit transmitted, received, and stripped from the data stream. A True or False Syndrome bit "S" is then produced to indicate a true or false comparison, as the case may be. The value of that Syndrome bit (T or F) is indicative of whether the check bit reencoded at the receiver is the same as the Test Check Bit produced by the transmitter encoder and stripped from the Test Check Bit location in the received data stream in.

The received data stream may contain a series of packets, Pqo, Pqi . . . Pqn-1, Pqn. In the preferred embodiment, the end of packet Pn is contiguous with the start of the next packet. The next packet then is contiguous with the start of the next successive packet and so on. The object is to correctly locate the start of each packet by locating the check bits and for the following process of decoding and interpreting the packet check bit in each of the packet data bits. A Test Check Bit location may be chosen, for example, at bit location 3 in packet Pqi. However, as would be apparent to those skilled in the art, this test check bit location may be at any bit location within packets Pq1, or any other packet in the incoming data stream, without affecting the principals of the invention.

The Syndrome "S" bits are produced using the stripped Test Check Bit from the transmitted data and the receiver reencoded check bit. The "S" bits are then counted as good or bad Syndrome bits. For example, in the preferred embodiment a Good Syndrome bit may be a digital "0" or "T" showing coincidence of the encoded check bit produced at the receiver with the Test Check Bit stripped from the data stream at the Test Check Bit location. A Bad Syndrome bit would then be a digital "F" or "1."

Where the Syndrome bit indicates a match by a "T" or "0" bit, the probability is increased that the Test Check Bit stripped from the data stream and used for comparison with the encoded bit produced at the receiver, has been identified as at the correct check bit location. In this case, identification of the start of packet may be easily made as will be recognized by those skilled in the art. However, since digital data is in one or two states, "0" or "1," a probability exists a Syndrome bit may incorrectly indicate a coincidence or match between the check bit sent and check produced at the receiver.

For example, the bit tested as the check bit may be the bit at packet bit location 3. It may have the same phase as the check bit producing a good "S" bit. In order to reduce the error, a plurality of check bits in a plurality of packets are tested and the successive Syndrome "S" bits are counted as Good or Bad. Where the said Syndrome bits produced are a total of good Syndrome bits ("GT") with respect to a predetermined threshold, then the check bit location tested is accepted as the correct check bit location and the location of the start of the packet can easily be accomplished.

In the case the Syndrome count exceeds a total of Bad Syndrome bits ("BT") with respect to the threshold, then the bit location in the stream of data bits selected as the test check bit location is shifted by one to a new Test Check Bit location and a new Syndrome count is accumulated.

This Syndrome Count is accumulated for each Test Check Bit location in the respective packets and compared to the Threshold THP1 until the Syndrome bit count exceeds the good count threshold, THP3 indicating a correct Test Check Bit location or the bad count threshold, THP2 indicating a incorrect Test Check Bit location.

In the event all of the bit positions equal to a packet length (for example 24 in the preferred embodiment) are counted without a good total Syndrome count ("GT"), the same test is repeated for phase ambiguity due to the four possible phases of the check bit with reference to the demodulating sinusoid. Of these four possibilities, the first is the I&Q channel in the case of phase quadrature transmission are correct in phase and there is no ambiguity.

A second possibility of ambiguity exists where the demodulating sine and cosine sinusoids are phase shifted cosine and sine waves (i.e., cos=sin and sin=cos). A third phase ambiguity occurs where the demodulating sine and cosine sinusoids are inverted (i.e., cos=−cos, sin=−sin). A fourth possibility of phase ambiguity exists where the demodulated sine and cosine sinusoid are phase shifted cos and sin waves and inverted (i.e., cos=−sin, sin=−cos).

These phase shifts produced by the relative phases of demodulating sinusoids produce phase ambiguities causing the Syndrome bit count to incorrectly accumulate a bad count (BT). Accordingly, where this phase ambiguity exists, each of the bit locations in an interval equal to a packet length (in the preferred embodiment 24 bit locations) would be tested without producing a correct Good Syndrome count ("GT").

Accordingly, if after having testing, each of the bit positions in the packet, without producing a Good Syndrome count GT, the test may be repeated testing for phase ambiguity by manipulating the I&Q bits in the data stream by an exchange in place, or by inversion, or exchange in place and inversion. Each time a change is made in the polarity or the position of the I&Q bits, a test is made as described above for each of the 24 bits until a Good Syndrome count GT above the threshold is obtained.

A Good Syndrome count GT demonstrates the data received is correct and also shows the parity or check bit location has been properly identified. Using this check bit location, the packet start and end locations may be identified.

Accordingly, what is shown is a digital data system employing a method for identifying the location of check bit within a stream of digital data. As shown in the preferred embodiment, the digital data stream is in packet form containing starting and ending boundaries and a predetermined test check bit location. In the process, a bit location is selected in the data stream defining a test check bit. In the process of defining a test check bit location, an image packet having boundary conditions referenced to that test check bit location is similarly defined. The data in that image packet exclusive of the bit at the test check location is then used to reencode a new check bit. The new check bit is compared with the test check bit and a syndrome bit indicative of the comparison is produced. These syndrome bits are counted. In the preferred embodiment the syndrome bits are counted as good or bad syndrome bits and compared with a threshold. Where the comparison shows the syndrome bit count exceeds the threshold, the test check bit location is identified as correct and the image packet boundaries are identified as correct. In the event the test check bit location is identified as incorrect, then the test check bit location is shifted relative to the data stream and the process is repeated.

The system which is used to locate the correct check bit location according to the foregoing method uses a means for selecting a test check bit location in the data stream. Where this data stream is in the form of packets having a predetermined boundary conditions, then the test check bit location identifies the associated boundary conditions of the image packet. In the process, the data in the image packet exclusive of the check bit at test check bit location is used to reencode a new check bit using the same algorithm as used to encode the check bit in the packet as transmitted. Means are then provided for producing a syndrome bit indicative of the comparison of the test check bit with the new check bit. Where that comparison indicates the test check bit location is correct and is in fact the location of the original encoded and transmitted check bit, then the image packet is identified as the correct image packet. If the identification indicates the check bit location is incorrect, then means are provided for shifting the test check bit location and enabling the above specified means to repeat the process.

The syndrome bit count is accumulated over a predetermined number of packets. The accumulated count is compared to a threshold to produce a Good or Bad count. The Good or Bad total count is used relative to respective thresholds to determine if the test check bit location is correct.

DESCRIPTION OF THE PREFERRED EMBODIMENT

Figure 1:
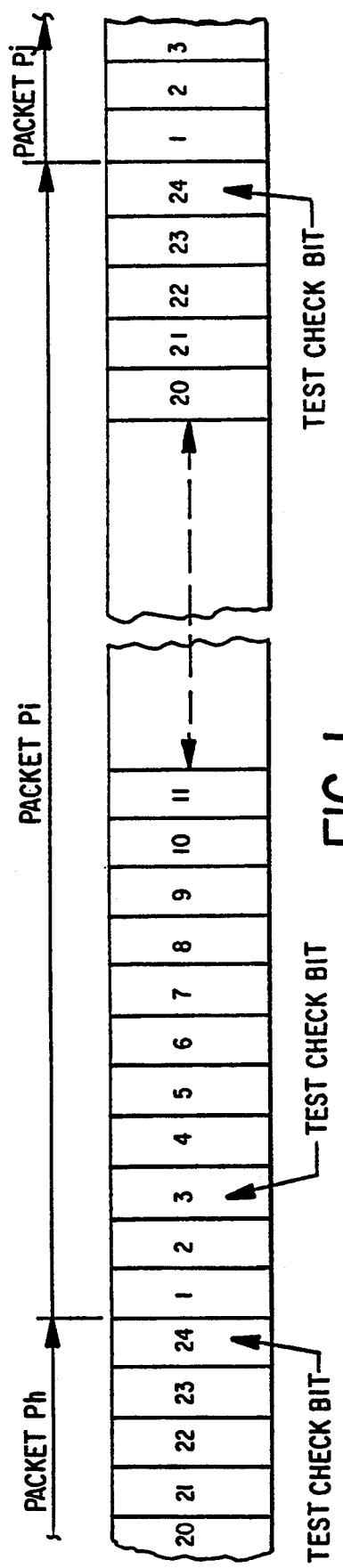
FIG. 1 shows a representative form, a 24 bit packet serial data stream.
Figure 2:
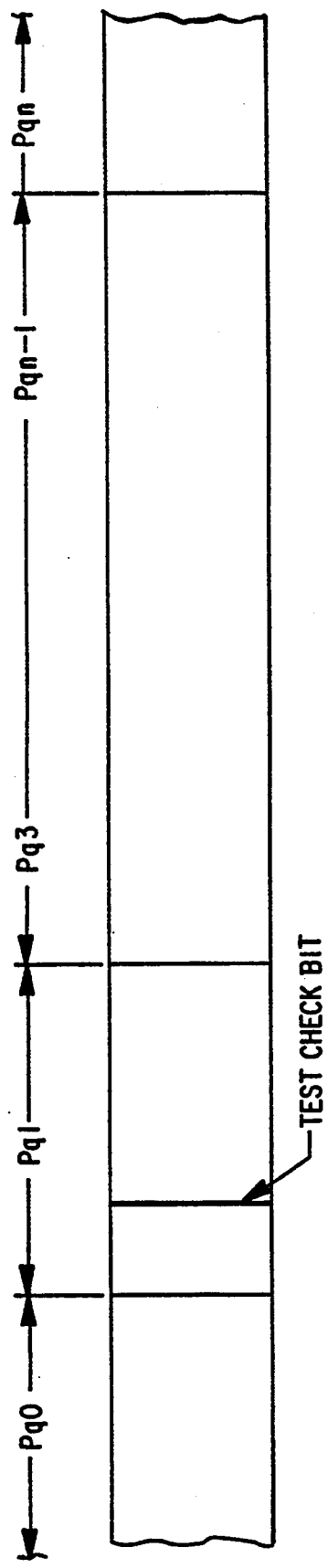
FIG. 2 shows a representative form as a series of multibit packets, for example, the packets of FIG. 1.

An example of the received data stream is shown in FIGS. 1 and 2. As shown, a series of multibit packets Ph to Pj is shown. The end of packet Ph for example is shown contiguous with the start of packet Pi. Packet Pi then is contiguous with the start of packet of Pj. The object is to locate the check bit location in the incoming serial data stream flow and to be able to interpret the check bit and data bits in each packet properly. The Test Check Bit location, for example and for purpose of explanation, is shown chosen at check bit location 3 in packet Pi. However, as would be apparent to those skilled in the art, this Test Check Bit location may be at any bit location within any of the packets Ph, Pi or Pj or any other packet in the incoming data stream without affecting the principles of the invention. A data stream which may comprise packets Ph, Pi and Pj is shown in FIG. 2 starting at bit Pqo and extending to bit Pqn. A Test Check Bit may be chosen, bit location 3, for example, in packet Pq1 and tested according to the principals of the invention as explained below.

Figure 3:
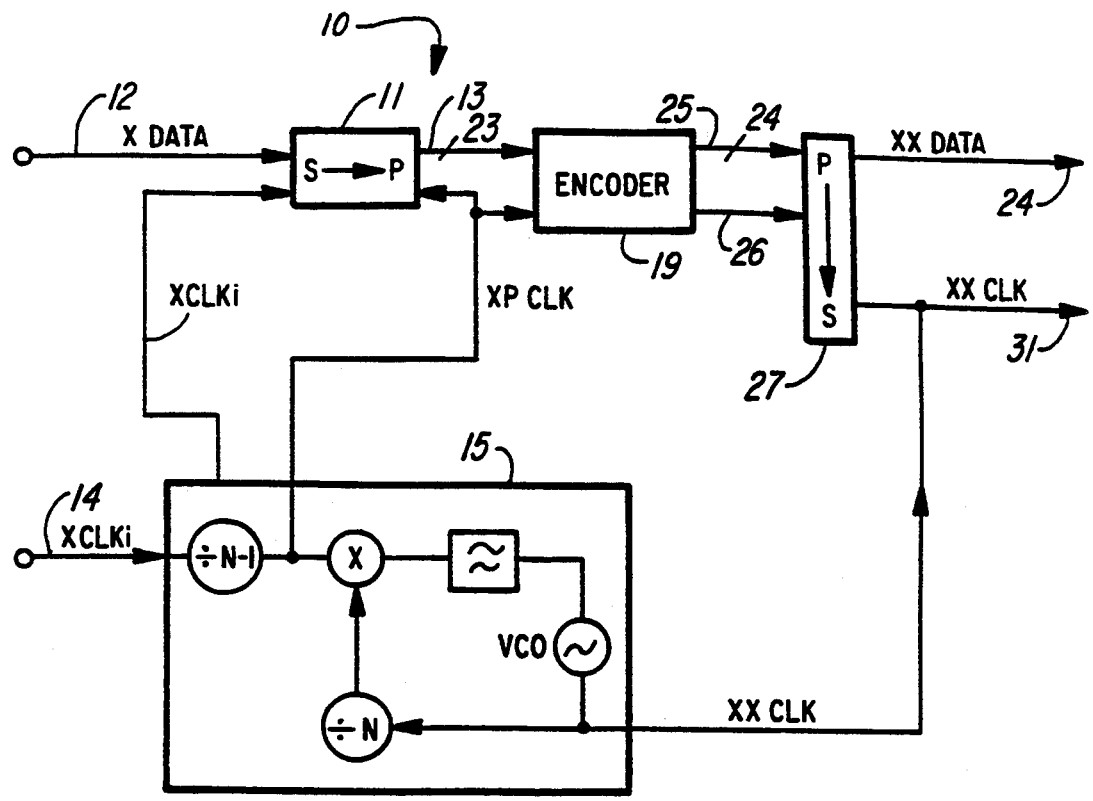
FIG. 3 shows, in block form, a transmitter system for producing an encoded check bit.
Figure 4:
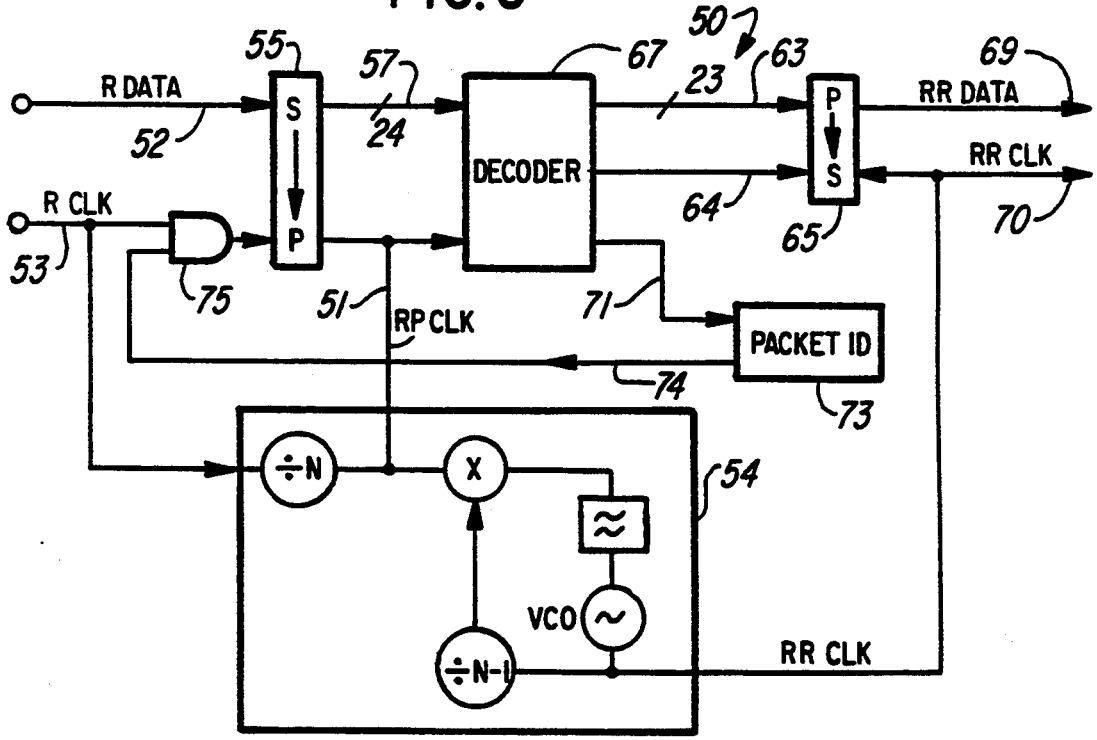
FIG. 4 shows a receiver system for receiving check bit encoded transmission, for example, from the transmitter of FIG. 3, and for producing and evaluating Syndrome bits according to the principles of the invention.

FIG. 3 and FIG. 4 shows, in block form is a digital radio transmitter and receiver, the transmitter shown in FIG. 3 and the receiver in FIG. 4. In FIG. 3 the transmitter section is shown generally by FIG. 10. As would be understood by those skilled in the art, the included portion of the digital radio transmitter for modulating a RF carrier and transmitting that modulated carrier is not shown. FIG. 3 accordingly, is limited to generation of the check bit encoded base band data shown as 23 bit packet serial Xdata on line 12 associated with Xclk on line 14. The Xdata generated in response to information, is provided to serial to parallel convertor 11. The Xclki signal associated with Xdata is provided to clock reference 15. Clock reference 15 provides clock signals XXclk to serial to parallel converter 11 and XSclk at the serial clock rate to parallel to serial convertor 27. Parallel clock signal XPclk is provided to parallel convertor 11 at the 23 bit parallel clock rate for clocking the parallel 23 bits on line 13 to Encoder 19.

In the preferred embodiment the XPclk is equal to Xclki/23. Encoder 19 then produces a 24 bit parallel packet on line 25. That 24 bits is the 23 bits on line 13 plus an encoded check bit, shown in the preferred embodiment as bit 24. Parallel to serial converter 27, under the control of clock XXclk on line 16 provides a clocking signal for clocking the 24 bit packet serial data XXdata on line 24 to the modulator section of the RF transmitter. Associated with XXdata on line 24 is XXclk clock on line 31. XXclk is 24/23 Xclki, in the preferred embodiment, as would be understood by those skilled in the art.

The transmitted XXdata and XXclk is shown as demodulated received data Rdata and Rclock in FIG. 4.

As would be understood by those skilled in the art the apparatus for receiving the RF signal modulated with the XXdata and the XXclk signals and for demodulating those signals to produce Rdata and Rclk is included but is not shown. Rdata on line 52 is applied to serial to parallel convertor 55. The Rclk clock signal on line 53 is provided to parallel convertor 55 and to reference clock 54. The serial to parallel convertor 55 under to control of RPclk on line 51 clocks the 24 bit packet in parallel from serial to parallel converter 55 to the decoder 67 on line 57. The 24 bit packet includes 23 bits of information and 1 check bit as shown for example in FIG. 1. The Rclk as would be used to clock the serial Rdata into the serial to parallel converter 55.

In the preferred embodiment, RPclk is equal to Rclk/24. RRclk=23RPclk

The decoder section 67 selects a Test Check Bit location in the preferred embodiment's 24 bit parallel data stream on line 54. For the purposes of explanation as shown in FIG. 1 and FIG. 2 that Test Check Bit location is shown as packet bit location 3. However, as would be apparent to those skilled in the art this Test Check Bit location may be any test check bit location in packet. Additionally, it would be understood by those skilled in the art, the packet length may be varied. Accordingly, the chosen test check bit location or the packet length or the placement of packets in the data stream, relative to other packets may be varied within the scope and principles of this invention.

A syndrome bit "S" is produced from the decoder on line 71. The syndrome bit is produced in the Decoder 67 using the same encoding algorithm as in Encoder 19. In this process, the bit in the 24 bit packet on line 57 located at the Test Check Bit location is stripped from that 24 bit packet. The remaining 23 bits are then used to encode a check bit according to the same encoding algorithm as used in the transmitter Encoder 19. The reencoded check bit is then compared to the stripped check bit location to produce the syndrome bit "S" on line 71. The process of producing a syndrome bit is well known to those skilled in the art and is not discussed in detail for that reason. That process of producing a syndrome bit through the use of a optimal convolutional orthogonal code decoder is shown in OPTIMAL CONVOLUTIONAL SELF-ORTHOGONAL CODE with an application to digital radio, (CSOC's) G. D. Martin, AT&T Bell Laboratories, North Andover, Mass. 01845; 1985 IEEE. The process of stripping the test check bit at the Test Check Bit location and using the remaining data bits in the packet to produce a reencoded check bit and then comparison with the stripped bit from the Test Check Bit location to produce the syndrome bit "S" can be accomplished by any number of well known processes, within the scope of the invention described here.

Figure 5:
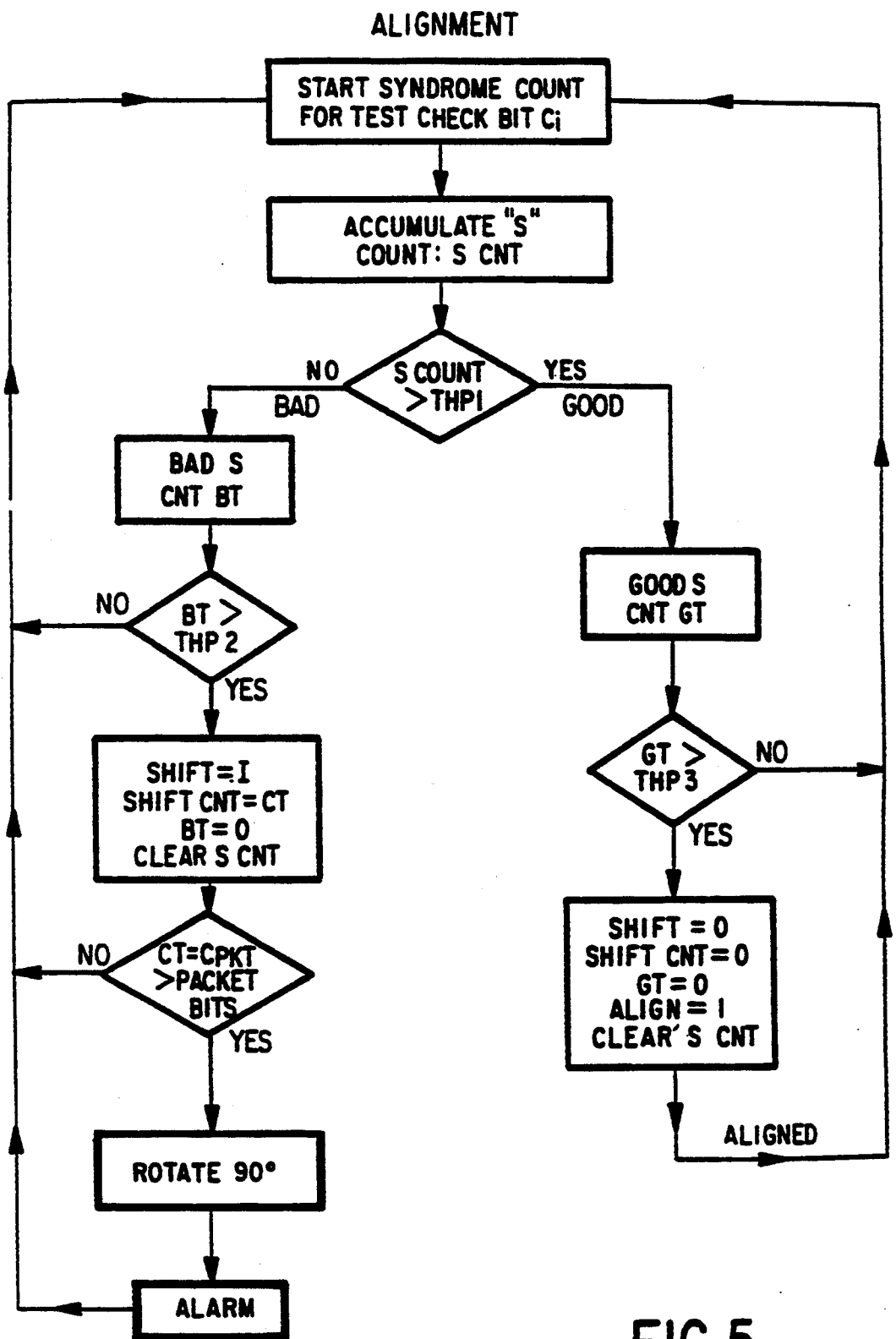
FIG. 5 shows the process for accumulating Syndrome bits, and testing the Syndrome bit count for of the true Test Check Bit location.

The syndrome bit "S" is provided to Packet ID 73 on line 71. As explained above, 23 bits remain after the bit at the Test Check Bit location is stripped from the 24 bit packet on line 57 in the preferred embodiment. This 23 bits are the provided in parallel on line 63 to the parallel to serial convertor 65. Packet ID 73 in response to the syndrome bid count as explained in connection with FIG. 5, provides a packet ID signal to gate 75. Gate 75 has a second input Rclk from clock 54. In accordance with the principles of the invention, a packet ID true SHIFT signal on line 74 in response to a Bad Total (BT) syndrome S bit count produced from a plurality of packet Test Check Bits, produces a signal to serial to parallel converter 55 through AND gate 75. The inputs to AND gate 75 are RCLK and the SHIFT output of Packet ID 73 on line 74. The output of the packed ID 73 on line 74 is the SHIFT signal or a "0" signal when the Bad Syndrome count BT is greater than THP2, as shown in FIG. 5. This SHIFT signal shown as a "Zero" in the preferred embodiment inhibits AND gate 75 and prevents it from passing the RCLK signal to converter 55 during the period SHIFT is "0" or "False". Accordingly, during the time the Packet ID 73 produces a "0" or "False" Shift signal on line 74, AND gate is inhibited from passing the RCLK signal for one clock interval preventing RDATA being shifted into the converter 55 and shifting the test bit location and the image packet frame defined by the packet start bit and end bits, by one bit. Identification of the Test Check Bit location as the correct check bit location in the incoming Rdata stream can be easily accomplished when as the check bit location is known relative to the start and end locations of the packets as shown in FIGS. 1 and 2. The RRclk is provided on line 70 for further processing of the RRdata on line 69.

In the preferred embodiment, the RRclk clock is equal to 23 Rclk/24.

The process according to the inventive principles for testing the checking the Test Check Bit locations, shifting test bit locations or for shifting the data for phase ambiguity is shown in FIG. 5. The Packet ID 73 contains counters, accumulators and shift commands functioning according to the flow chart of FIG. 5. The means necessary to operate the Packet ID whether in software or in hardware are not shown as they would be known to those skilled in the art.

FIG. 5 shows in flow chart form, the way the Syndrome bits are counted to determine whether the Test Check Bit location is the correct check bit location.

The Alignment process for identifying a test check bit location as the correct check bit location starts with an accumulation of the Syndrome "S" count ("S Cnt") for the test check bits $C_i$ at the Test Check Bit location chosen. The S Cnt is accumulated for a plurality of data packets and tested in comparison with a first threshold THP1. The process then continues as explained below depending upon whether the THP1 comparison is good or bad. A good S count (S Cnt) greater than THP1 is shown as GT. A bad S count (S Cnt) less than THP1 is shown as BT. As shown by the further processing of the count BT and GT, the test check bit location may be identified as the correct test check bit location and an alignment signal ("ALIGN") may be generated. If the count BT indicates an erroneous Test Check Bit location has been selected, the next bit location in the data strain may be selected and tested by generating a shift signal (Shift=1) and by shifting the Test Check Bit location and repeating the above process. A shift count shown CT is then accommulated. As shown, when that shift count CT corresponds to the length of the packet Cpkt, 24 bits in the case of the preferred embodiment, a test for phase ambuguity may begin by shifting or inverting the I&Q data. With each such shift, the process of testing the check bit location for the correct check location will start again as described below.

As shown in FIG. 5, an Alignment algorithm according to the principles of the invention, is used to identify or select a Test Check Bit location and its associated Image Packet. For explanation, an Image Packet is the data packet defined by the Test Check Bit location where the Test Check Bit location is True or correct, the Image Packet is True or correct. The Test Check Bit location in each Image Packet interval is tested using the Syndrome count. The Syndrome count total, S Cnt, is accumulated over a predetermined number of Image Packet intervals, as explained below. Where this Syndrome count GT over a number of Image Packet intervals is greater than a threshold, for example, THP1, a Good total count GT is accumulated. Conversely, where a Syndrome count over a selected number of Image Packet intervals is less than THP1, a Bad total count BT is accumulated.

As shown in the flow chart of FIG. 5, the S count, S Cnt, is accumulated and then tested against the threshold THP1. The S count, in the case of the preferred embodiment in accumulated over for 168 Test Check Bit locations for 168 packets. This number 168 corresponds to the 24 bit packet of the preferred embodiment and a number of memory elements used in the CSOC's encoding scheme as described above. The threshold THP1 is approximately equal to one-half of the memory elements, or in the case of the preferred embodiment 80. Accordingly, the total S Cnt accumulated for each 168 syndrome bits in the case of the 24 bit packet in the preferred embodiment, a comparison is made to THP1 to determine if the S Cnt of the number of good S bits is greater or less than the threshold THP1.

As shown on the flow chart, the counter for the Good Syndrome count GT will always be an integer greater than the bad Syndrome count BT where the number of good Syndrome bits ("T") is greater than the number of bad Syndrome bits ("F"). On the other hand, where the bad Syndrome count BT over the selected Image Packet interval is greater than the number of good Syndrome bits, the Bad total count BT will be an integer greater than GT. The accumulated Good total GT count and the accumulated Bad total count BT are tested at a second level separately in comparison with separate second level thresholds. These second level thresholds are shown as THP3 in the case of the Good count GT or THP2 in the case of the Bad count BT. If the accumulated Good total count GT is greater than THP3, no bit shift is made and the Test Check Bit location is accepted as the correct check bit location and the Image Packet is sent as RRdata on line 69 as correct. As shown, the Good Syndrome GT bit count is set to 0, the S Cnt is cleared and the "ALIGNED" signal is sent. The process of Alignment may then be repeated as in the preferred embodiment.

The Good Syndrome count GT is accumulated and compared with the GT threshold THP3. Where that good count GT is greater than the threshold THP3, the test bit location is accepted as the correct test bit location, the Image Packet associated with that Test Check Bit location is acknowledged as the True Packet and a True Alignment signal is generated (ALIGN=1) from the packet ID block 73. The alignment signal (ALIGN=1) may then be used within serial parallel to converter 65 to clock each bit location in the 23 bit packet in its correct alignment on bus 69 relative to the check bit location in the 24 bit packet. The Test Check Bit location process is then continued in the preferred embodiment. Where the check bit is used in further processing, the data packet on bus 69 would be a 24 bit packet, including the check bit. In this case, the RRclk would be at the 24 bit serial data rate.

If the Bad total count BT is greater than its respective threshold shown as THP2, the False or "0" SHIFT signal is produced on line 74 then the next successive bit in the serial pattern data stream, Rdata is selected, as the Test Check Bit location and the process is continued. As described above and understood by those skilled in the art, for the next Test Check Bit location, the Syndrome S Cnt for a selected interval of packets is accumulated and compared to THP1.

Each accumulated S Cnt less than THP1 increments the Bad total count BT. Accordingly, when that Bad total count BT is greater than THP2, indicating an incorrect Test Check Bit location, a bit shift ocurs to the next successive next Test Check Bit location in the data stream Rdata. In this case, the Shift=1 signal is produced, the shift count CT is incremented and the BT is set to 0.

Where each of the Test Check Bit locations in a 24 bit packet interval is tested as a Test Check Bit location producing a BT greater than THP2 and without producing a GT greater than THP3, the process above is repeated with the Test Check Bits tested for phase ambiguity. The 24 packet interval may be made shorter or longer, consistent with other requirements, within the principles of the disclosed invention.

In this case, as explained above, a phase ambiguity may occur where the demodulating sinusoid relative to the modulating sinusoid was phased shifted so that sin was interpreted as the cos, or the cos was interpreted as the sin or the phase ambiguity produced a inversion from sin to −sin or cos to −cos or a phase shift and an inversion from sin to −cos and from cos to −sin.

This phase ambiguity may be tested by rotating the demodulated sinusoid relative to the modulating sinusoid in 90° increments as shown in the FIG. 5, "Rotate 90°". This rotation of 90° may be by the following processes of exchanging I&Q channels, inverting I&Q channels and inverting I&Q channels and exchanging I&Q channels.

In the first case where the phase ambiguity was tested for a shift from sin to cos and cos to sin, the I&Q channels are exchanged and the process of determining whether the test bit location was correct as explained above would start again. The process would repeated as described above for the initial Test Check Bit location and would proceed through each of the 24 bits in the packet for the preferred embodiment or for a number of bits appropriate for any other size packet.

In the event that the process was unable to locate a correct Test Check Bit location, the second case possibility of phase ambiguity would be tested by inverting the I&Q data. The Test Check Bit process would be repeated again as described above using an initial Test Check Bit location and proceeding through all bit locations in a packet interval until a correct check bit location was found. Should this test fail, then the third case of phase ambiguity would be tested. In this case, the I&Q channel data would be exchanged and inverted and the test started again as shown.

As shown in FIG. 5, a GT greater than a selected threshold shown as THP3 signifies the Test Check Bit location chosen is correct. At this point, the Image Packet referenced to that satisfactory Test Check Bit location may be used to correctly identify the packet start and ending location. This would be well known to those skilled in the art and is not discussed here.

The thresholds may be any suitable thresholds providing a reliable indication. In the case of the preferred embodiment, the threshold THP1 is set at a number slightly greater than one-half of the bit locations in a packet interval.

THP2 and THP3 may be set at a count of 3 or 6, for example, or any other threshold needed as a reliable indicator.

A shift counter CT=Cpkt is shown which counts the number of shifts produced for the Test Check Bit location when result, BT exceeds THP2. When this number equals the packet length (24 in the preferred embodiment), the phase of the I&Q channels is altered as described above and the process restarts.

As each Test Check Bit location is tested producing a BT greater than THP2, a Shift=1 signal is produced causing a shift to the next successive Test Check Bit location. The shift count CT is accordingly incremented). The accumulated count BT is set to 0 and the Syndrome count S Cnt is cleared. The next Test Check Bit location is then tested as described above by accumulating a Syndrome count S Cnt for a predetermined number of Image Packets associated with the Test Check Bit location and comparing that S Cnt with the S count threshold THP1.

A count is kept of the number of shifts to be next Test Check Bit location. The bit count is shown as CT equals Cpkt. Where Cpkt is indicative of the number of bits in a packet or the packet length. As stated above, that can be any length and in the preferred embodiment is shown as 24 bits. CT is equal to Cpkt indicates, the process of testing each Test Check Bit location in a packet is through each possible bit location in the packet. At that point, as shown in the flow chart, test is made for phase ambiguity. In this case, as shown in the flow chart, a shift of the I&Q data is made, the count CT is set to 0 for each shift and the process of testing each Test Check Bit location in the packet length continues. In the event a correct check bit location cannot be identified, the process would continue possibly by sounding an alarm as required for a particular application.

As would be understood in the art, the order the shift required for phase ambiguity testing shown as I to Q and Q to I, or I to −I and Q to −Q, or I to −Q and Q to −I, may be varied in any order desired.

As would be evident to those skilled in the art, the invention as described for the preferred embodiment may be varied as is well known to those skilled in the art without departing from the principals of the invention.

For quadrature amplitude modulated data, the quadrature related I&Q bits are alternated within the data packet to avoid ambiguity. By alternating the quadrature related I&Q data bits within the packet, for QAM the occurrence of an incorrect syndrome bit can be avoided.

I claim:

1. In a digital data system transmitting digital data in data packets, a method for identifying the check bit location within said data packets, by counting syndrome bits, comprising the steps of:
   a. selecting a test check bit location in said data packets;
   b. producing a new check bit from said data packets; using said digital data in said packet without said test check bit;
   c. comparing said test check bit at said test check bit location with said new check bit;
   d. producing a syndrome bit indicative of said comparison;
   e. counting said syndrome bits;
   f. comparing said syndrome bit count with a good threshold and a bad threshold;

g. identifying said test check bit location as correct when said syndrome bit count exceeds said good threshold; or h. identifying said test check bit location as incorrect when said syndrome bit exceeds said bad threshold and shifting said test check bit location relative to said data stream and repeating steps a. to h.

2. The method of claim 1 wherein said step g. includes the step of:

i. using said correct check bit location to locate the boundaries of said data packets.

3. The method of claim 2 including the step of:

j. producing an alignment signal to mark said boundaries.

4. The method of claim 3 including the step of:

k. repeating the process of steps a. to h. in response to said alignment signal.

5. The method of claim 1 including the steps of:

l. counting the number of shifts of said test check bit location relative to the number of data bit locations in a data packet, and m. establishing a shift count threshold and in response to said shift count exceeding said shift count threshold repeating said steps a. to h. and performing a test for phase ambiguity.

6. The method of claim 5 wherein said step of performing a test for phase ambiguity includes the steps of:

n. exchanging the phase of phase quadrature related I and Q data bits, or;

o. inverting the phase of the respective phase quadrature related I and Q data bits; or p. exchanging the phase and inverting the exchanged phase of phase quadrature related I and Q data bits.

7. The method of claim 5, including the steps of:

q. rotating the phase of said I&Q data bits in 90° increments.

8. The method of claim 7 wherein said altering includes the step of:

r. rotating the phase of said data bits relative to the phase difference between a signal used for modulation by, and demodulation of, said data stream, in 90° increments.

9. The method of claim 8, including the steps of:

s. using said data stream to modulate a first signal and using a second signal to demodulate said data stream; and t. changing the phase of said data bits to test for differences in phase between said first and second signals used in the said modulation and demodulation process.

10. The method of claim 8, wherein:

u. said data stream comprises phase quadrature I and Q data bits and, v. said I and Q data bits are:
 i. exchanged I to Q and Q to I; or
 ii. inverted I to −I and Q to −Q, or
 iii. exchanged and inverted I to −Q and Q to −I.

11. The method of claim 1 including the steps of:

w. identifying said syndrome bits as Good or Bad bits in response to said comparison, and x. accumulating a count of said Good and Bad syndrome bits, y. identifying said test check bit location as correct when said Good count exceeds a Good count threshold or identifying said test check bit location as incorrect when said Bad count exceeds a bad count threshold.

12. The method of claim 1:

z. wherein a count of Good or Bad syndrome bits are accumulated for a predetermined number of packets in said data stream, aa. said count is compared to a first threshold to produce a Good syndrome bit count signal or a Bad syndrome bit signal, and ab. said Good and Bad syndrome bit signals are accumulated as Good or Bad syndrome counts and compared to respective Good syndrome and Bad syndrome count thresholds to identify a correct test check bit location or an incorrect test check bit location.

13. The method of claim 2 wherein:

ac. said count of good or bad syndrome bits are accumulated for said predetermined number of packets related to the number of data bits in the packets and the encoding method used to produce the check bit, ad. said first threshold is set to approximately one-half of said predetermined number of packets.

14. The method of claim 1 including the step of repeating step h. in response to a bad syndrome count.

15. A system for transmitting digital data in packets and for identifying the check bit location within said packets, by counting syndrome bits, comprising:

a. means for selecting a test check bit location in said data packets;

b. means connected to said means for selecting, for using said packet data without said test check bit for producing a new check bit from said data steam;

c. said means connected to said means for producing a new check bit, including means for comparing said test check bit at said test check bit location with said new check bit d. said means connected to said means for producing a new check bit, including means for producing a syndrome bit indicative of said comparison;

e. said means connected to said means for producing a syndrome bit, including means for counting said syndrome bits;

f. said means connected to said means for counting said syndrome bits, including means for comparing said syndrome bit count with a first threshold and with a second threshold;

g. said means connected to said means for counting said syndrome bits, including means for identifying said test check bit location as correct when said syndrome bit count exceeds said first threshold and identifying said test check bit location as incorrect when said syndrome bit count exceeds said second threshold; and h. means connected to said means for identifying for shifting said test check bit location in said data packet and said means for selecting, selecting a new test check bit location in response to said means for identifying said test check bit location as incorrect when said syndrome bit count does exceeds said second threshold.

16. The system of claim 15 including:

i. means connected to said means for identifying, for using said identified correct check bit location to locate the boundaries of a data packet in said data stream.

17. The system of claim 16 including:

j. said means for locating the boundaries of a data packet including means for producing an alignment signal to mark said data packet boundaries, in response to said means for identifying said test check bit location as correct.

18. The system of claim 15 including:
   k. said means for locating the boundary of a data packet including means for counting the number of shifts of said test check bit locations said data packet; and
   l. means connected to said means for counting and means responsive to said count exceeding a shift count threshold for selecting a new test check bit location and testing for phase ambiguity.

19. The system of claim 18 wherein said means for testing for phase ambiguity includes:
   i. means for exchanging the phase of phase quadrature related I and Q data bits;
   ii. means for inverting the phase of the respective phase quadrature related I and Q data bits; or
   iii. means for exchanging the phase and inverting the exchanged phase of phase quadrature related I and Q data bits.

20. The system of claim 18 wherein said means for testing for phase ambiguity includes:
   n. means for rotating the phase of selected data bits in said data packet in 90° increments.

21. The system of claim 20 wherein said means for altering includes:
   o. means for changing the phase of said data bits relative to the phase difference between a signal used for modulation by, and demodulation of, said data.

22. The system of claim 21 wherein said means for changing the phase of said data bits includes:
   p. means for using a first signal to modulate said data1 and using a second signal to demodulate said data; and
   q. means for changing the phase of said data bits to test for differences in phase between said first and second signals used in the said modulation and demodulation.

23. The system of claim 22 wherein:
   r. said data stream comprises phase quadrature I and Q data bits, and
   s. said means for changing the phase includes means for:
      i. exchanging I to Q and Q to I, or
      ii. inverting I to −I and Q to −Q, or
      iii. exchanging and inverting I to −Q and Q to −I.

24. The system of claim 15 including:
   t. means connected to said means for comparing means for identifying said syndrome bits as good or bad bits in response to said comparison;
   u. said means for identifying including means for accumulating a count of said good and bad syndrome bits; and
   v. said means for identifying including means for identifying said test check bit location as correct when said good count exceeds a good count threshold or identifying said test check bit location as incorrect when said bad count exceeds a bad count threshold.

25. The system of claim 24 wherein:
   w. said means for accumulating a count of good or bad syndrome bits for a predetermined number of data packets;
   x. said means for comparing said count relative to a first threshold to produce a good syndrome bit count signal or a bad syndrome bit signal; and
   y. said means for accumulating said good and bad syndrome bit signals as good or bad syndrome counts and comparing said syndrome counts to respective good syndrome and bad syndrome count thresholds to identify a correct test check bit location in response to a good syndrome count above said good syndrome count threshold and an incorrect test check bit location in response to a bad syndrome count above said bad syndrome count threshold.

26. The system of claim 25 wherein:
   z. said means for accumulating said count of good or bad syndrome bits are accumulated for said predetermined number of packets related to the number of data bits in the packets and the encoding method used to produce the check bit,
   aa. said first threshold is set to approximately one-half of said predetermined number of packets.

27. The system of claim 25 including:
   ab. means for enabling said means for shifting said test check bit location in response to a bad syndrome count.

28. A method for using the location of a check bit in a digital data stream transmitted in data packets, to establish the boundaries of said packets by counting syndrome bits, comprising the steps of:
   a. selecting a test check bit location in the data packets and defining an image packet with reference to said test check bit location;
   b. using the data within said image packet except for said test check bit to produce a new check bit;
   c. comparing said test check bit with said new check bit;
   d. producing syndrome bits indicative of said comparison and counting said syndrome bits;
   e. comparing said syndrome bit count with a good threshold and a bad threshold identifying said test check bit location as correct when said syndrome bit count exceeds said good threshold and identifying said test check bit location as incorrect when said syndrome bit count exceeds said bad threshold and shifting said test check bit location in said data stream and repeating the steps a. through e.

* * * * *